US010101364B2

(12) United States Patent
Schloss

(10) Patent No.: US 10,101,364 B2
(45) Date of Patent: Oct. 16, 2018

(54) ELECTRICAL CIRCUIT TESTER WITH AN EDGE LIT DISPLAY

(71) Applicant: Ben Schloss, Belmont, CA (US)

(72) Inventor: Ben Schloss, Belmont, CA (US)

( * ) Notice: Subject to any disclaimer, the term of this patent is extended or adjusted under 35 U.S.C. 154(b) by 0 days.

(21) Appl. No.: 14/253,167

(22) Filed: Apr. 15, 2014

(65) Prior Publication Data

US 2015/0293148 A1    Oct. 15, 2015

(51) Int. Cl.
*G01R 31/02* (2006.01)
*G01R 1/067* (2006.01)

(52) U.S. Cl.
CPC ................. *G01R 1/06788* (2013.01)

(58) Field of Classification Search
CPC ...... G01R 31/28; G01R 1/06; G01R 1/06788; G01R 1/06772; G01R 19/155
USPC .................................. 324/72.5, 70
See application file for complete search history.

(56) References Cited

U.S. PATENT DOCUMENTS

| | | | | |
|---|---|---|---|---|
| 4,027,236 A | * | 5/1977 | Stewart ................ | G01R 19/145 324/133 |
| 4,740,745 A | | 4/1988 | Sainz | |
| 5,604,436 A | * | 2/1997 | Henritzy ................ | G01R 31/44 324/133 |
| 5,789,911 A | * | 8/1998 | Brass ..................... | G01R 19/14 324/133 |
| 6,433,530 B1 | * | 8/2002 | Pool .................... | G01R 1/06788 324/133 |
| 6,512,361 B1 | * | 1/2003 | Becker ............... | G01R 1/06788 324/133 |
| 6,512,631 B2 | | 1/2003 | Becker | |
| 6,888,341 B2 | * | 5/2005 | Johnson ............. | G01R 1/06788 324/133 |
| 7,385,382 B2 | * | 6/2008 | Wilferd ............. | G01R 1/06788 324/715 |
| 7,681,347 B1 | * | 3/2010 | Welker ................ | G02B 6/0016 40/546 |
| 8,368,415 B2 | * | 2/2013 | Jaite ..................... | G01R 31/024 324/72.5 |
| 9,970,965 B2 | * | 5/2018 | Whitehead ............. | G01R 19/14 |
| 2004/0239308 A1 | * | 12/2004 | Fazzina .............. | G01R 1/06788 324/99 D |
| 2006/0061367 A1 | * | 3/2006 | Chenn .................. | G01R 19/155 324/503 |
| 2006/0232280 A1 | * | 10/2006 | Chen .................... | G01R 19/155 324/556 |
| 2014/0203315 A1 | * | 7/2014 | Kim ................... | G02B 19/0028 257/98 |

OTHER PUBLICATIONS

SnapOn Catalog 1200, 2012, cover page, back page and p. 436, Snap-On Incorporated, Kenosha, WI, USA.
(Continued)

*Primary Examiner* — Tung X Nguyen
*Assistant Examiner* — Dominic Hawkins
(74) *Attorney, Agent, or Firm* — James R. Cypher; Charles R. Cypher

(57) ABSTRACT

A circuit tester is provided in which an edge lit display is incorporated into the handle of a circuit tester and the indicators lights are arranged in the handle, and the handle is formed in such a manner, that the indicator lights can also illuminate the work area of the circuit tester.

20 Claims, 4 Drawing Sheets

(56) References Cited

OTHER PUBLICATIONS

Panasonic Lithium Handbook, Pin Type Lithium Batteries (BR Series): Individual Specifications, Aug. 2005, one page, Panasonic Corporation, Germany.
Avago Technologies Datasheet, AV02-1770EN—Sep. 3, 2012, 16 pages, Avago Technologies, USA.

* cited by examiner

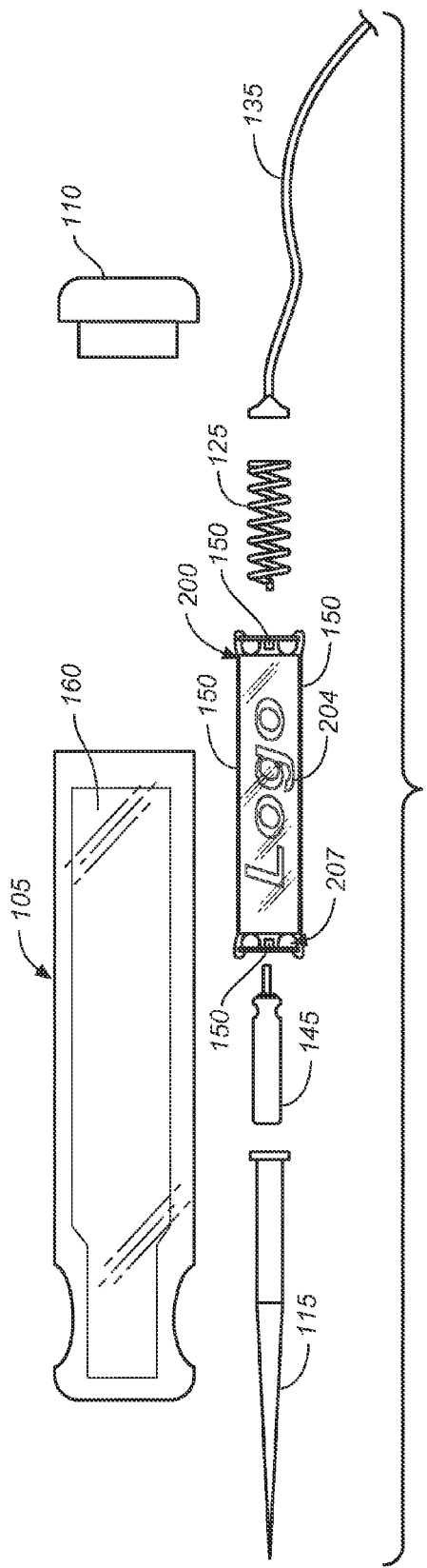
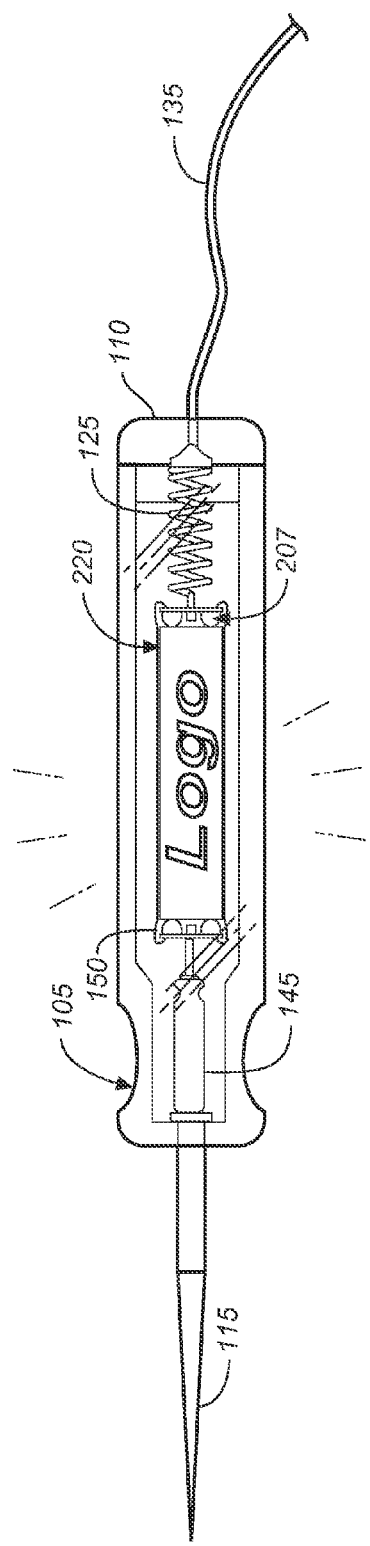
FIG. 3
FIG. 4

US 10,101,364 B2

ELECTRICAL CIRCUIT TESTER WITH AN EDGE LIT DISPLAY

BACKGROUND OF THE INVENTION

The present invention relates to an electrical circuit tester, and more particularly to a tester that provides a light source for the user and also provides a lighted display within the handle of the tester for illuminating a message such as an advertisement or brand name.

Electrical circuit testers are well known in the art. Such testers are frequently used by automotive technicians and enthusiasts to determine the status of automotive electrical systems. It is common for circuit testers to be made with a screwdriver-type design with one or more light sources contained within the handle to indicate different states of the circuit being tested.

Edge lit signs are lighted signs that produce a pleasing effect where a design or figure (which may include characters or other symbols) incorporated into the sign is displayed brightly against a darkened, translucent background. Edge lit signs use a light source employed adjacent one or more edges of a light transmissive panel or substrate. It is now typical to use light emitting diodes as the light source for edge lit signs. Edge lit signs have been described in the patent literature, and such patents include U.S. Pat. No. 6,094,849, granted to James A Phillips et al, the entire disclosure of which is hereby incorporated herein by reference; U.S. Pat. No. 6,471,388, granted to Brent Marsh, the entire disclosure of which is hereby incorporated by reference; and U.S. Pat. No. 7,681,347, granted to Brian Hart Welker et al, the entire disclosure of which is hereby incorporated by reference.

The present invention provides a circuit tester in which an edge lit display is incorporated into the handle of a circuit tester and the indicator lights are arranged in the handle, and the handle is formed in such a manner, that the indicator lights can also illuminate the work area of the circuit tester.

SUMMARY OF THE INVENTION

The present inventions provides a circuit tester wherein the light sources that are typically used to indicate the status of the circuit being tested are also used to illuminate the probe of the tester and to illuminate an edge lit sign contained within the handle of the tester. The edge lit display has a light transmissive panel having a front face and an opposed rear face with at least one of the front and rear faces having a figure formed by at least one groove recessed into the face, the panel further having one or more light entering surfaces, the one or more of the light entering surfaces having a light source in close proximity thereto.

The circuit tester of the present invention can be used for testing electrical systems. The circuit tester includes a handle portion that can be easily gripped by a technician, a screwdriver-type probe tip designed to typically contact the hot or positive side of a circuit, and a ground designed to typically contact the negative side or ground of an electrical circuit. The handle portion and the probe tip are preferably substantially similar in size, shape and form to a manual screwdriver.

The handle portion is preferably composed of a material that is sufficiently transparent such that light from the light sources, which are preferably LEDs, may be viewed through the material of the handle, and such that the light sources can shine light through the front of the handle to illuminate the area surrounding the probe. Only portions of the handle need be transparent where it is desired that the LEDs and the edge lit sign are to be viewed and the probe tip illuminated.

The tester further includes electrical circuitry that is operatively coupled to the probe tip and the ground. This circuitry can be configured to sense different electrical states of an electrical system, such as the presence of a voltage drop and the amount of the voltage drop. These voltages can be measured according to the voltage drop between the probe tip and a ground, with the ground being the reference point from which the voltage drop is measured. The circuit can also be configured to provide a visible display that informs the technician as to the voltage level of the tested electrical system by emitting light of a first color when a low system voltage is identified, and light of a second color when a high system voltage is identified.

In another aspect of the present disclosure, a method is provided for testing an electrical system and generating a light source for the operator directed at the probe tip and a lighted display for advertising or some other purpose. The method is implemented using the tester of the present invention. The method includes connecting the probe tip to an electrical circuit, connecting the ground so as to form a circuit, and generating light from the electrical current passing through the probe to create a visible display and illuminate the probe tip. The circuit, the light sources and the edge-lit display can be arranged to perform both of these functions simultaneously, or just one at a time, depending on the state of the circuit being tested.

BRIEF DESCRIPTION OF THE DRAWINGS

FIG. 3 is a exploded view of the tester of the present invention

FIG. 4 is an assembled view of the tester of the present invention.

DETAILED DESCRIPTION

The present disclosure relates to a hand-held circuit tester 100 incorporating an edge lit display 200 inside a cavity 160 in the handle 105 of a circuit tester 100 and a method for using such a circuit tester 100.

Figure 1:
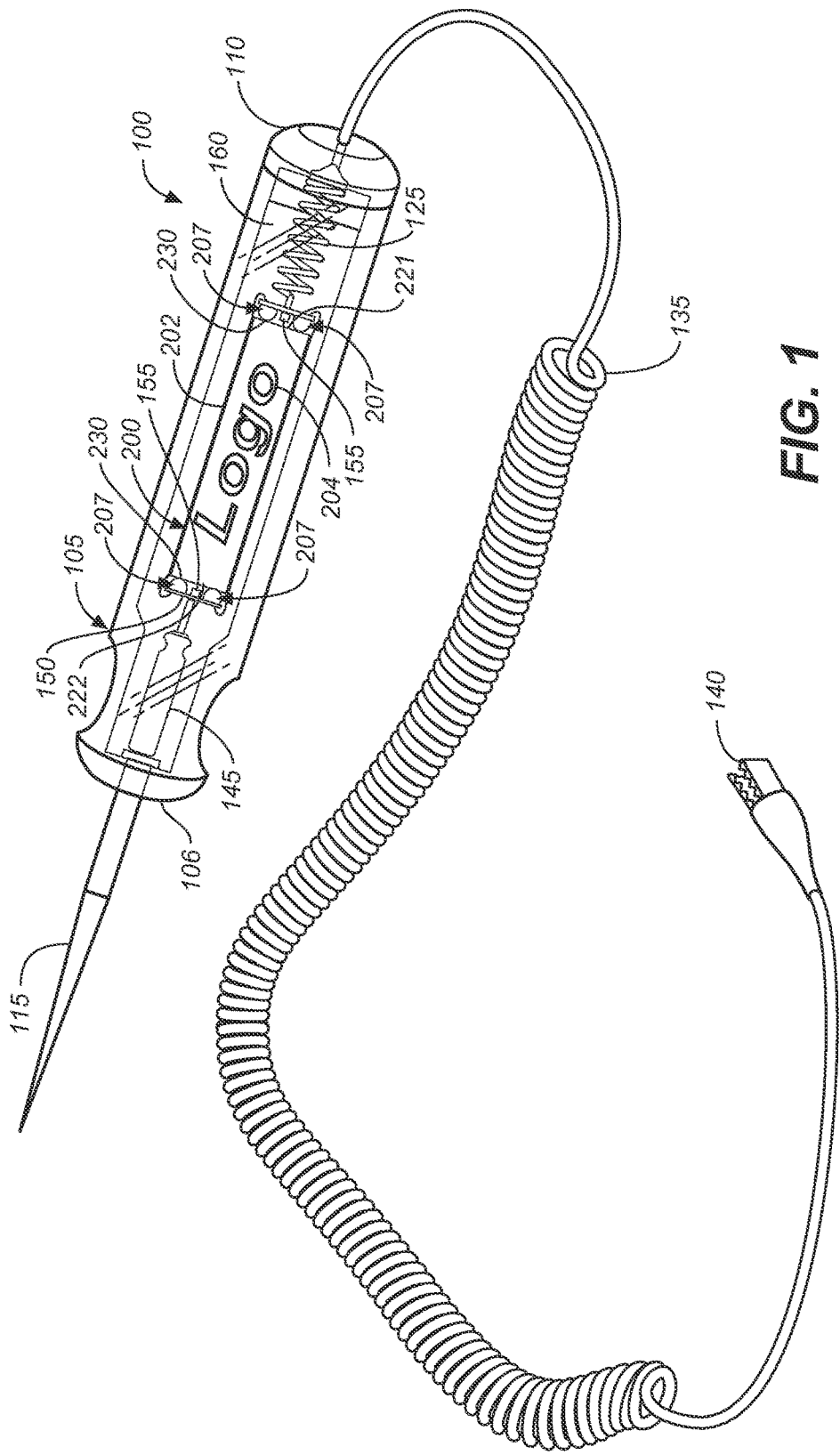
FIG. 1 is a perspective view of the circuit tester of the present invention.
Figure 2:
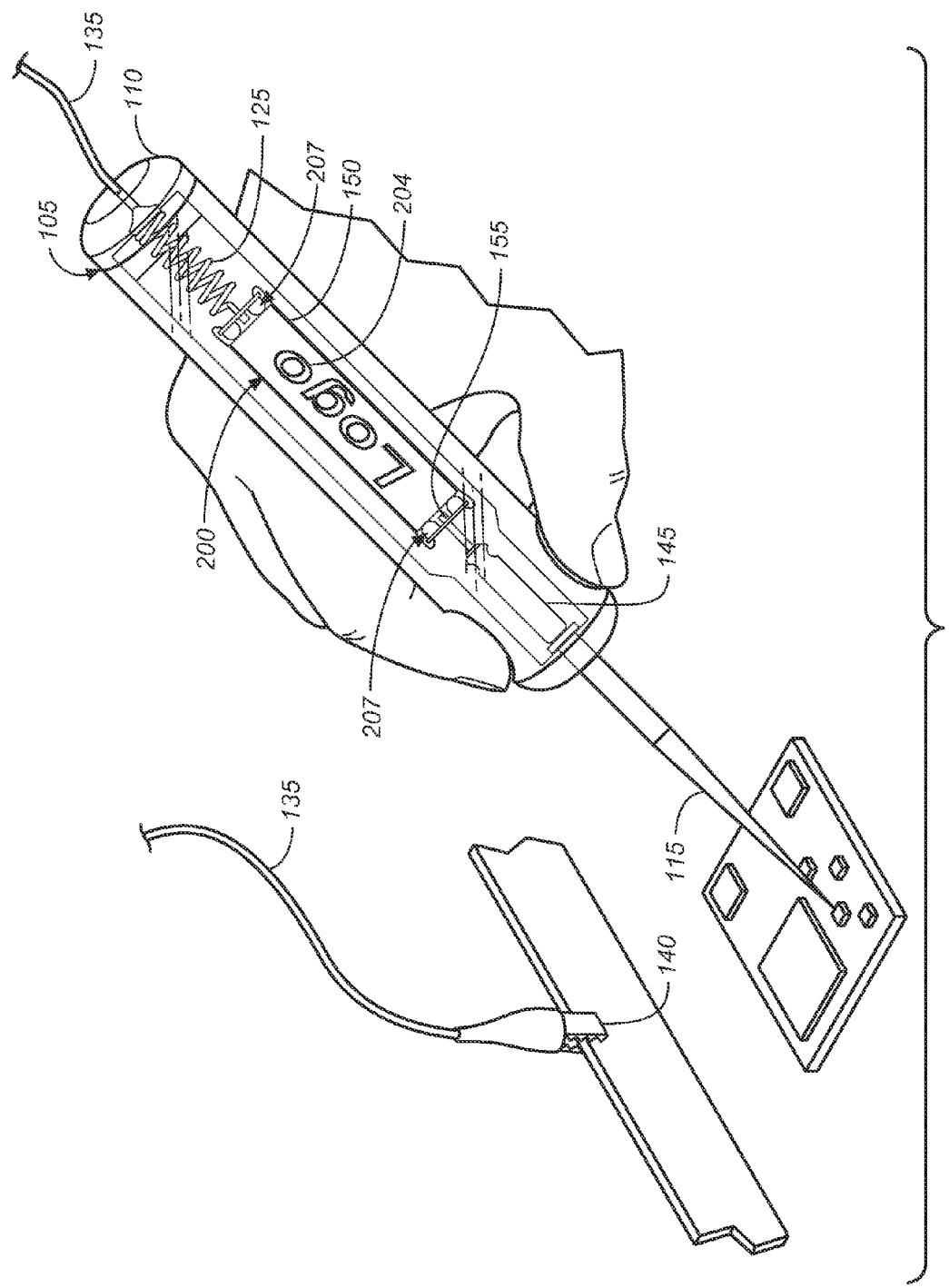
FIG. 2 is a perspective view of the circuit tester of the present invention in use.
Figure 5:
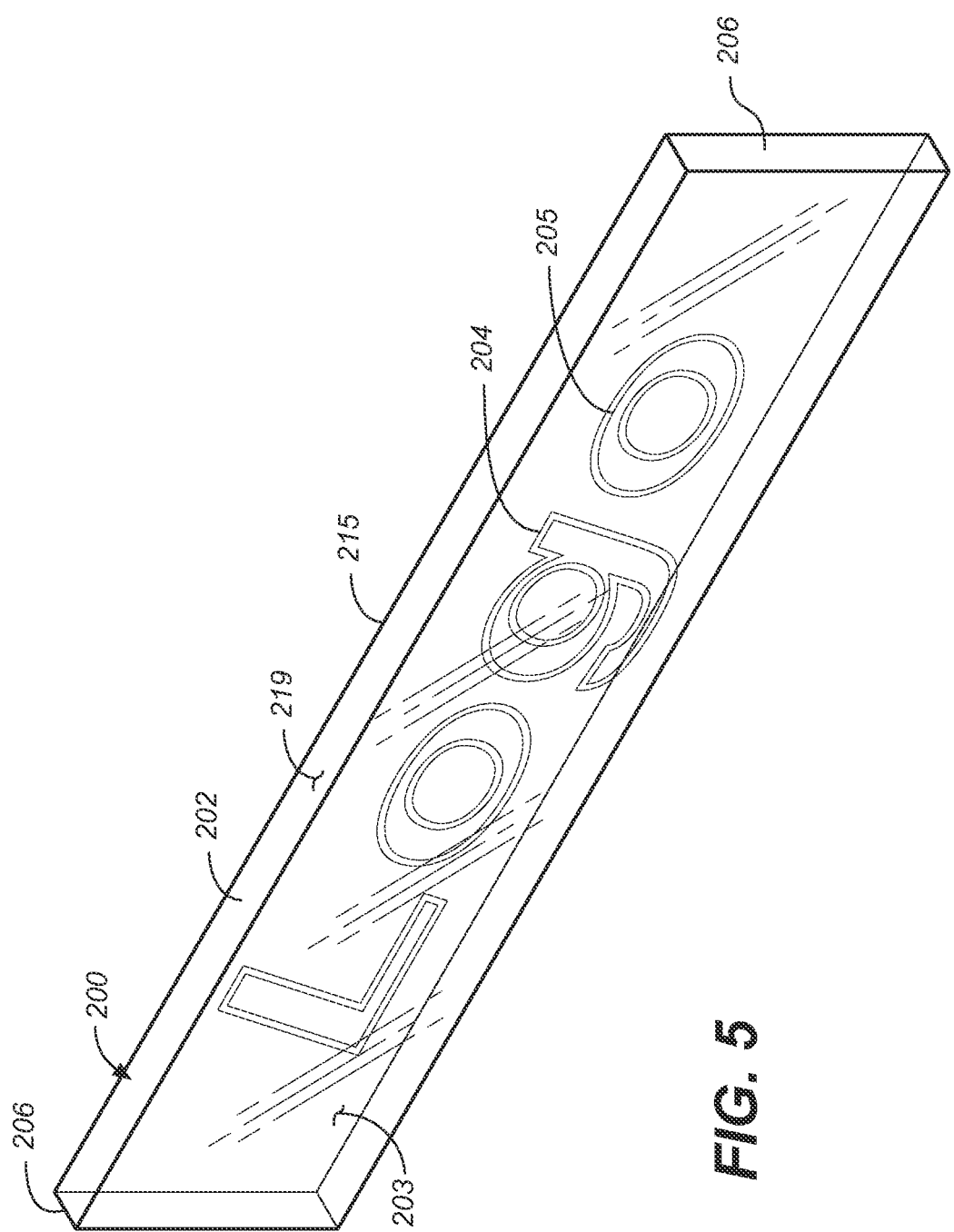
FIG. 5 is a perspective view of the transmissive panel of the present invention.

FIG. 1 illustrates a view of a handheld voltage or circuit tester 100 having an edge lit display 200 and one or more light sources 207. The tester 100 preferably includes a handle 105, a cap 110, a probe 115, a spring assembly 125, a retractable coil chord 135, a ground device 140, a battery 145, a conducting system 150 connected to the probe 115, and one of the other conducting elements, the conducting system 150 including the one or more light sources 207. The edge lit display 200 is arranged in the handle to work with the one or more light sources 207 of the conducting system 150.

The handle 105 and probe tip 115 are substantially the shape and size of a screwdriver. The probe 115 is made of a conductive material such as a steel alloy or other suitable material. The probe 115 is designed for connection with wires and contacts in an electrical circuit. Portions of the handle 105 are preferably composed of a material that is sufficiently transparent so that the one or more of the light sources 207, preferably light emitting diodes (LEDs) 207 that are part of the circuit subassembly 150 and the edge lit display 200 are visible to the technician when the tester 100 is in operation. The preferred and simplest method of doing this is making the handle completely out of a translucent material. It is also a feature of the present invention that the front end 106 of the handle 105 that carries the probe 115 be translucent such that light from the LEDs 207 and the edge lit display 200 shines on the area in contact with the probe 115 to aid the technician. Examples of materials of sufficient transparency include any polymer material available in transparent grades, such as polycarbonate, acrylic, nylon, cellulose acetate, cellulose butyrate, among others. The LEDs 207 provide a visual indication or indications of the state of the electric circuit being tested. Alternatively, or in addition to the transparent material, the handle 105 may include openings or portions of a different transparency (not shown) through which one or more LEDs 207 may be viewed.

For clarity and convenience, the edge lit display 200 of the current invention is described in a single orientation (except as noted otherwise) in which a top 221 is oriented away from the probe 115 and the bottom 222 is oriented towards the probe 115. The edge lit display 200 can, nevertheless, be installed in essentially any orientation, so that the top 221 can be oriented in the direction of the probe 115.

The edge lit display 200 has one or more light transmissive panels 202, preferably one, each having a front face 203 and an opposed rear face 215 with at least one of the faces 203 and 215 having a FIG. 204 formed by at least one groove 205 recessed into that face 203 or 215. The panel or panels 202 of the light emitting display 200 further have one or more light entering surfaces 206 and the one or more of the light entering surfaces 206 each has one or more light sources 207 in close proximity thereto. The one or more light sources 207 are part of an electrical circuit or conducting system 150 through which the one or more light sources 207 can be energized.

In the preferred embodiment, the groove 205 is formed with sides that have an acute angle relative to the smooth surface 203 or 215 of the panel 202. A light entering surface 206 is formed on at least one side or edge of the panel 202. The light entering surface 206 can be formed to diffuse the light entering the panel 202. The light entering surface 206 extends transversely relative to the faces 203 and 215 of the panel 202. The grooves 205, recessed into one of the smooth front or rear faces 203 or 215 of the panel 202, and the light entering surface 206 are parts of a one-piece substrate forming the panel 202.

The panel 202 is preferably formed with opposed smooth front and rear faces 203 and 215, with peripheral edges 219 extending between the opposed faces 203 and 215. The panel 202 is preferably made from a molded plastic, such as acrylic.

In the preferred embodiment, a plurality of light sources 207 are used and consist of light emitting diodes 207. In the preferred embodiment, the panels 202 are made with light entering surfaces 206 at the top 221 and bottom 222 of the edge lit display 200. When the one or more panels 202 are arranged in the typical orientation described above, light emitted from the LEDs 207 at the top 221 of the edge lit display 200 shines through the light entering surface 206 to be dispersed and to evenly shine through the panel 202 to strike the sides forming the at least one groove 205 to form an illuminated edge lit image or FIG. 204 conforming to the sides of the at least one groove 205, and also shines through the surface 206 at the bottom 222 of the edge lit display 200 and through the front end of the handle 106 to illuminate the probe 115. Light emitted from the LEDs 207 at the bottom 222 of the edge lit display 200 also illuminates the probe 115, in part by being partially reflected by the light emitting surface 206 at the bottom 222 of the edge lit display 200.

In the preferred embodiment, where the light source 207 is formed from light emitting diodes 207, the tester is made with four individual light emitting diodes 207. A pair of LEDs 207 is provided at the top 221 of the edge lit display 200 and a pair is disposed at the bottom 222 of the edge lit display 200. The LEDs are arranged with their lenses 230 facing the light entering surfaces 206 of the edge lit display 206. In a preferred embodiment a red LED 207 is provided at the top 221 of the edge lit display 200 and the bottom 222 of the display 200 and these LEDs 207 are energized together. Similarly, in the preferred embodiment, a green LED 207 is provided at the top 221 of the panel 202 and the bottom 222 of the display 200 and these LEDs 207 are energized together. The individual light emitting diodes 207 emit light through the panel 202 between the faces 203 and 215 of the panel 202.

The preferred LEDs 207 can handle high thermal temperatures and high driving currents. They have a long operation life and a wide viewing angle. The preferred LEDs have a low profile and an very small foot print. The ASMT-JR10-ARS01 (red diode) and AMT-JC-11-NST01 (green diode) from Avago Technologies are preferred.

In the preferred embodiment, the electrical conducting system 150 will include a number of resistors 155 which impede the flow of current in the conducting system 150, especially before the diodes 207, thus protecting against overdriving the diodes and burning them out. If resistors 155 are used in the electrical conducting system 150, and they are in the preferred embodiments of the invention to protect the LEDs 207, 560 Ohm—ERJ-6ENF5600V resistors from Panasonic are preferred.

In the preferred embodiment, the tester 100 is also provided with a battery 145 as part of the conducting system. The battery 145 is preferably a 3 volt battery. The battery 145 can be connected to the circuit 150 to provide a reference circuit value or it can be wired to show that a proper connection has been made between the test point and the ground so that the technician knows that that tester is not defective, and that an effective ground has been provided for the circuit. Preferably, the battery 145 is rechargeable, and when the probe and ground are arranged in a particular manner the battery 145 can be recharged. Preferably, the battery 145 is very thin and much smaller than the cavity 160 in the handle 105. In the preferred embodiment, the battery 145 is preferably a cylinder with a small diameter, and formed with a highly reflective housing. This aids in the transmission of light from the LEDs 207 to and out the front 106 of the handle 105. The 3 Volt BR 435/BNPin Type Lithium Battery available from Panasonic is preferred.

The spring assembly 125 provides two functions. One advantage of the spring assembly 125 is that it acts as an electrical conductor. The spring assembly 125 may be made of a conductive material such as a steel alloy, copper, or any other suitable material. Another advantage of the spring assembly 125 is that it acts as a compression and cushioning device. In this respect, the spring assembly 125 protects the electronic circuitry on the electrical subassembly 150 within the handle 105 by providing a cushioning action from forces experienced by the handle 105.

A tester 100 formed according to the present invention could be used as a continuity tester when attached in line to circuits to find opens. It can be used to check relay switching. It can be used to check an automotive charging system operation by determining the voltage drop in the circuit being tested. The electrical conducting system 150 could be arranged in a number of different ways with a combination of different light sources 207 to measure different characteristics of electrical circuits. Circuit testers 100 have been described in the patent literature, and such patents include U.S. Pat. No. 6,888,341, granted to Robert D. Johnson et al, the entire disclosure of which is hereby incorporated herein by reference; U.S. Pat. No. 6,512,361, granted to Thomas P. Becker, the entire disclosure of which is hereby incorporated by reference; and U.S. Pat. No. 4,740,745, granted to Michael A. Sainz, the entire disclosure of which is hereby incorporated by reference.

I claim:

1. A circuit tester for an electrical system, the tester comprising:
   a. a handle, having a cavity within the handle;
   b. a probe, the probe coupled to the handle and being capable of contacting a circuit point of an electrical circuit;
   c. a ground device coupled to the handle and capable of contacting a ground point or a circuit point of an electrical circuit;
   d. an electrical conducting system disposed within the handle and operatively coupled to the probe and the ground device, the electrical conducting system being configured to sense electrical characteristics at the circuit point and the electrical conducting system having a plurality of light sources that can be energized depending on the state of the electrical circuit, and
   e. an edge lit display separate from the handle and disposed within the cavity in the handle, the edge list display having a top and a bottom and the top is oriented away from the probe and the bottom is oriented towards the probe, wherein the edge lit display has one or more light transmissive panels having a front face and an opposed rear face with at least one of said front and rear faces having a figure formed by at least one groove recessed into the face, the one or more panels further having light entering surfaces at the top and bottom of the edge lit display, each of the light entering surfaces having a plurality of the light sources disposed in close proximity thereto, and at least some of the light sources at the top and bottom of the edge lit display are of a similar color and are energized simultaneously when they are energized; wherein
   f. the figure formed in one of the front and rear faces of the one or more light transmissive panels is displayed brightly against a darkened, translucent background when light from the plurality of light sources at the top and bottom of the edge lit display that are of a similar color are energized simultaneously and enter the plurality of light entering surfaces of the one or more light transmissive panels.

2. The tester of claim 1, wherein one or more portions of the handle portion are composed of a material that is sufficiently transparent such that the plurality of light sources and the edge lit display are visible through the material when the one or more light sources are energized.

3. The tester of claim 1, wherein one or more portions of the handle portion are composed of a material that is sufficiently transparent such that the plurality of light sources and the edge lit display are visible through the material.

4. The tester of claim 3, wherein:
   a. the handle has a front end, and
   b. a portion of the front end of the handle is composed of a material that is sufficiently transparent such that the plurality of light sources emit light through the front end of the handle to illuminate the probe.

5. The tester of claim 4, wherein:
light emitted from the plurality of light sources at the top of the edge lit display shines through the light entering surfaces to be dispersed and to evenly shine through the one or more light transmissive panels and through the front end of the handle to illuminate the probe.

6. The tester of claim 5, wherein:
   a. at least some of the plurality of light sources are light emitting diodes; and
   b. the light sources disposed in close proximity to light entering surfaces at the top of the top of the edge lit display are light emitting diodes.

7. The tester of claim 6, wherein:
the light emitting diodes have lenses and the light emitting diodes are arranged with their lenses facing the light entering surfaces of the edge lit display.

8. The tester of claim 1, wherein:
the face in which the groove is recessed of the at least one of said front and rear faces is a smooth face, and the groove is formed with sides that have an acute angle relative to the smooth face.

9. The tester of claim 5, wherein:
the face in which the groove is recessed of the at least one of said front and rear faces is a smooth face, and the groove is formed with sides that have an acute angle relative to the smooth face.

10. The tester of claim 4, wherein:
light emitted from the plurality of light sources at the bottom of the edge lit display shines through the light entering surfaces to be dispersed and to evenly shine through the one or more light transmissive panels and shines through the front end of the handle to illuminate the probe.

11. The tester of claim 10, wherein:
   a. at least some of the plurality of light sources are light emitting diodes; and
   b. the light sources disposed in close proximity to light entering surfaces at the bottom of the top of the edge lit display are light emitting diodes.

12. The tester of claim 11, wherein:
the light emitting diodes have lenses and the light emitting diodes are arranged with their lenses facing the light entering surfaces of the edge lit display.

13. A method for testing an electrical circuit with the circuit tester of claim 1, the method comprising the steps of:
   a. connecting the probe device to a circuit point of an electrical circuit; and
   b. connecting the ground device to a ground.

14. The method of claim 13, wherein one or more portions of the handle portion are composed of a material that is sufficiently transparent such that the plurality of light sources and the edge lit display are visible through the material when the one or more light sources are energized.

15. The method of claim 13, wherein one or more portions of the handle portion are composed of a material that is sufficiently transparent such that the plurality of light sources and the edge lit display are visible through the material.

16. The method of claim 15, wherein:
   a. the handle has a front end, and
   b. a portion of the front end of the handle is composed of a material that is sufficiently transparent such that the plurality of light sources emit light through the front end of the handle to illuminate the probe.

17. The method of claim 16, wherein:

light emitted from the plurality of light sources at the top of the edge lit display shines through the light entering surfaces to be dispersed and to evenly shine through the one or more light transmissive panels and through the front end of the handle to illuminate the probe.

18. The method of claim 17, wherein:

a. at least some of the plurality of light sources are light emitting diodes; and b. the light sources disposed in close proximity to light entering surfaces at the top of the top of the edge lit display are light emitting diodes.

19. The method of claim 18, wherein:

the light emitting diodes have lenses and the light emitting diodes are arranged with their lenses facing the light entering surfaces of the edge lit display.

20. The method of claim 16, wherein:

light emitted from the plurality of light sources at the bottom of the edge lit display shines through the light entering surfaces to be dispersed and to evenly shine through the one or more light transmissive panels and shines through the front end of the handle to illuminate the probe.

* * * * *